US008238576B2

(12) United States Patent
Cooper et al.

(10) Patent No.: US 8,238,576 B2
(45) Date of Patent: Aug. 7, 2012

(54) LEVEL DEPENDENT BASS MANAGEMENT

(75) Inventors: Joel McKee Cooper, Lafayette, CO (US); John L. Melanson, Austin, TX (US); Pu Liu, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 1423 days.

(21) Appl. No.: 11/238,338

(22) Filed: Sep. 29, 2005

(65) Prior Publication Data

US 2007/0003075 A1 Jan. 4, 2007

Related U.S. Application Data

(60) Provisional application No. 60/695,731, filed on Jun. 30, 2005.

(51) Int. Cl.
*H03G 5/00* (2006.01)

(52) U.S. Cl. ............................ 381/99; 381/98; 381/104

(58) Field of Classification Search ............ 381/98–109, 381/10, 300, 303, 307, 58–59, 94.1–94.9
See application file for complete search history.

(56) References Cited

U.S. PATENT DOCUMENTS

| | | | | |
|---|---|---|---|---|
| 4,113,983 | A * | 9/1978 | Steel | 381/98 |
| 5,172,358 | A * | 12/1992 | Kimura | 369/47.26 |
| 5,550,923 | A * | 8/1996 | Hotvet | 381/72 |
| 6,349,285 | B1 | 2/2002 | Liu et al. | 704/500 |
| 6,687,379 | B1 * | 2/2004 | Thiel | 381/99 |
| 7,016,509 | B1 * | 3/2006 | Bharitkar et al. | 381/98 |
| 7,315,625 | B2 * | 1/2008 | Iwasaki et al. | 381/104 |
| 7,466,829 | B1 * | 12/2008 | Anderson | 381/103 |
| 7,894,614 | B2 * | 2/2011 | Cordell | 381/103 |
| 2004/0032959 | A1 * | 2/2004 | Montag et al. | 381/103 |
| 2004/0057587 | A1 * | 3/2004 | Thiel | 381/98 |
| 2005/0094828 | A1 * | 5/2005 | Sugimoto | 381/98 |
| 2005/0094829 | A1 * | 5/2005 | Cordell | 381/103 |

(Continued)

FOREIGN PATENT DOCUMENTS

EP 122663 A2 * 10/1984

(Continued)

OTHER PUBLICATIONS

S.C. Wang et al., U.S. Appl. No. 60/585,072, filed Jul. 6, 2004, entitled "Technique for Subwoofer Distance Measurement".
J.C. McKee Cooper, U.S. Appl. No. 11/057,367, filed Feb. 15, 2005, entitled "Multipass Parametric or Graphic EQ Fitting".
J.C. McKee Cooper et al., U.S. Appl. No. 11/061,736, filed Feb. 21, 2005, entitled "Band-Limited Polarity Detection".
S. Temme, "Audio Distortion Measurements," Bruel & Kjaer, pp. 1-20.

(Continued)

*Primary Examiner* — Vivian Chin
*Assistant Examiner* — Fatimat O Olaniran
(74) *Attorney, Agent, or Firm* — Hamilton & Terrile, LLP; Kent B. Chambers

(57) ABSTRACT

A signal processing system includes a level dependent bass management system. The level dependent bass management system utilizes audio input signal level information to apply at least one of multiple, available bass management solutions to generate one or more output signals from the audio input signal. In at least one embodiment, initially the level dependent bass management system boosts components of the audio input signal in the low frequency range by an amount sufficient to at least partially compensate for low frequency attenuation of the first speaker without exceeding one or more acceptable limitations of the signal processing system. If boosting alone cannot completely compensate for low frequency attenuation of the first speaker without exceeding one or more acceptable limitations of the signal processing system, the level dependent bass management system processes the audio input signal using an alternate low frequency management solution.

44 Claims, 10 Drawing Sheets

U.S. PATENT DOCUMENTS

| | | | | |
|---|---|---|---|---|
| 2005/0276425 | A1 * | 12/2005 | Forrester et al. | 381/104 |
| 2007/0071255 | A1 * | 3/2007 | Schobben | 381/98 |

FOREIGN PATENT DOCUMENTS

| | | |
|---|---|---|
| EP | 0287057 | 10/1988 |
| WO | WO2004004409 | 1/2004 |
| WO | WO2005041618 | 5/2005 |
| WO | WO 2005041618 A1 * | 5/2005 |

OTHER PUBLICATIONS

Dolby "Bass Management Implementation Guide," Issue 1, 2002, pp. 1-49.

M. Shashoua et al., "Bass Extension Comparison: Waves MaxxBass® and SRS TruBass™," Feb. 2002, pp. 1-29.

International Search Report and Written Opinion for PCT/US2006/026440 dated Oct. 24, 2006.

* cited by examiner

LEVEL DEPENDENT BASS MANAGEMENT

CROSS-REFERENCE TO RELATED APPLICATION

This application claims the benefit under 35 U.S.C. §119 (e) of U.S. Provisional Application No. 60/695,731, filed Jun. 30, 2005 and entitled "Level Dependent Bass Management." Provisional Application No. 60/695,731 includes exemplary systems and methods and is incorporated by reference in its entirety.

BACKGROUND OF THE INVENTION

1. Field of the Invention

The present invention relates in general to the field of information processing, and more specifically to a system and method for providing level dependent management of bass audio signals.

2. Description of the Related Art

FIG. 1 depicts a magnitude frequency response 100 of an example "non-ideal" speaker and of an "ideal" speaker. The frequency response line 102 of the "ideal" speaker ("speaker") has a flat frequency response across the entire range of human hearing, generally accepted to be from 20 Hz to 20 kHz. The frequency responses of a few high-end speakers approach the goal of obtaining a flat frequency response 102. However, the frequency response of low- to mid-end speakers do not come close to the ideal flat response. The frequency response of the majority of actual speakers including all low- to mid-end speakers deviates from a flat response in several frequency ranges with the range of human hearing. The frequency response curve 104 represents the frequency response of an example, non-ideal speaker. The most pronounced deviation from the ideal flat frequency response curve 104 is almost always in the lower frequencies, which happens to also be where people most easily notice the non-flat, attenuated frequency response. Most consumers consciously or subconsciously evaluate the quality of a speaker based on the loudness and clarity of low frequency audio output. A louder, clear low frequency ("bass") response generally evaluates to a perceived "better" speaker. Thus, one solution to compensate for an attenuated low frequency response, as indicated in the frequency response curve 104, is to boost the gain of low frequencies to obtain a flatter frequency response. For low-level input signals, boosting is a viable option. However, the ability of audio systems to boost low level frequencies declines as input signal levels increase. A typical 20 dB/decade frequency response fall-off from a flat response can require a gain boost factor of 10 to return to a flat response. Thus, boosting a high level signal can easily exceed the maximum available power. Additionally, boosting a high level signal can cause circuit components to clip, cause digital-to-analog converters to clip, and can physically damage speakers.

True low frequency response generally requires large, expensive drivers, and mass-market home audio is driven by low cost and aesthetics. The two goals of flatter frequency response and low cost are, thus, inherently incompatible.

The problem of a non-flat frequency response is even worse in televisions, where the speakers are generally smaller and cheaper than even the cheapest separate speakers. Cathode ray televisions are further hindered from achieving flatter low frequency response in the television speakers by the fact that large magnet structures normally used in low frequency speaker drivers would need to be heavily shielded to avoid distorting the video image.

Various solutions have been adopted to compensate for the inherently poor low frequency response of non-ideal speakers. One example solution is a fixed frequency bass management system. FIG. 2 depicts an audio system 200 with a conventional 5:1 speaker configuration. The 5:1 speaker configuration has six (6) separate audio signal channels for driving six speakers. The 5:1 speaker configuration includes a left main speaker 202, a right main speaker 204, a left satellite speaker 206, a right satellite speaker 208, and a front center speaker 210. In addition to other features, the 5:1 speaker arrangement allows an audio design engineer to incorporate sound origination location into an audio soundtrack. The main speakers 202 and 204 and front center speaker are generally larger than the satellite speakers 206 and 208. Thus, the low frequency responses of the main speakers 202 and 204 and front speaker 210 are generally flatter at lower, bass frequencies than the satellite speakers 206 and 208. The 5:1 speaker arrangement also includes low frequency equipment ("LFE") such as subwoofer bass speaker 212. The subwoofer speaker 212 is designed to have a more ideal response in the 20-100 Hz frequency range. Audio frequencies at or below 100 Hz are considered non-directional because most people cannot discern the location from which sound originates if the frequency is at or below about 100 Hz. Thus, the location of the subwoofer speaker 212 is not critical to the 5:1 speaker arrangement.

The audio system 200 also includes a signal processing system 214 that provides the audio drive signals that drive the speakers to produce sound. The signal processing system 214 is, for example, a television, digital versatile disk player, video cassette recorder, stereo system, or other system that is or includes an audio component.

The audio system 200 includes a fixed frequency bass management system 216. Bass management refers to filtering, routing, and mixing low-frequency content to maximize low-frequency response at a system level. For stereo systems with only two loudspeakers, bass management is not particularly useful because there is nowhere to route the low-frequency content that the speakers cannot reproduce. However, in a typical home theater system, such as audio system 200, the bass management system 216 filters out the low-frequency content from the satellite speakers 206 and 208 and adds the low frequency content to the respective main speakers 202 and 204. In this way, the entire content intended for the satellite speakers is preserved, although it is now being reproduced by a different speaker than originally intended. Since humans cannot normally discern the direction from which a sound comes if it is below about 100 Hz, humans will not notice the difference if the low-frequency content is being reproduced by the satellite speakers 206 and 208 (as intended) or by the main speakers 202 and 204 or the subwoofer speaker 212. Since the subwoofer speaker 212 is dedicated to reproducing low-frequency sound, the subwoofer speaker 212 provides a single point to which all low frequencies can be routed. Thus, the satellite speakers 206 and 208 and main speakers 202 and 204 can be smaller and cheaper and, thus, have less than optimal low frequency response.

During setup of the bass management system 216, a cross-over frequency or frequencies are selected. The cross-over frequencies are the frequencies at which the bass management system 216 mixes and/or routes low frequency audio signals from one speaker to another speaker that is better suited for low frequency sound reproduction. The crossover frequencies can either be fixed values for some defined set of listening levels (e.g. low, nominal, loud), or preferably can be continuously variable as a function of output level. In at least one embodiment, the filter structure and control of the bass management system 216 changes the filter without introducing undesirable audio artifacts (e.g., clicks, thumps, zipper-noise, etc.). Currently, bass management in the fixed frequency bass management system 216 is static. That is, the filtering, routing and mixing is configured once during system setup and then left alone. This situation is true whether the system setup is performed manually by the user, or automatically by the system using technology such as Cirrus Logic Inc.'s Intelligent Room Calibration ("IRC"), ADI's Auto Room Tuner ("ART"), Yamaha's Yamaha Parametric Room Acoustic Optimizer ("YPAO"), Audyssey Labs' MultEQ, and Bose's AdaptiQ, etc.). The cross-over frequency is fixed for all audio signal levels and remains static for the signal processing system 214. This manner of setup is not optimal because the frequency response of the speakers is not constant across listening levels. For example, bass management could be setup to route low-frequency content below 100 Hz from the left and right main speakers 202 and 204 to the subwoofer speaker 212. At nominal listening levels, this setup might be optimal, but, as the volume is increased, the small main speakers may start to distort frequencies higher than 100 Hz. This distortion at high volume could be prevented by increasing the crossover frequency to 120 Hz, but only at the cost of some loss of directionality at lower listening levels.

Television signal processing systems typically have very small speakers with very little low-frequency response, rolling off as high as 200 Hz, and generally no subwoofer speaker. In these cases, bass management does not involve any routing or mixing, just filtering out low-frequency content to protect the speakers. A fixed filter frequency is not ideal because the speakers will be able to safely reproduce lower frequencies at lower volumes than at higher listening levels.

Another solution adopted to compensate for the inherently poor low frequency response of non-ideal speakers is psycho-acoustic bass extension ("PBE"). The theory behind PBE is that humans can be "tricked" into thinking they hear a low-frequency sound by synthesizing some combination of the higher frequency harmonics of the desired low frequency sound and reproducing the harmonics instead of the original frequency. While not as good as the "real thing", the PBE technique can be surprisingly effective. Implementations of PBE date back at least several hundred years to the use of 20 Hz and 40 Hz pipes in churches to substitute for 10 Hz low frequency sound. Several psycho-acoustic bass extension (PBE) algorithms exist in the market today, such as Waves MaxxBassg by Waves Audio Ltd. with offices in Knoxville, Tenn. and SRS TruBass™ by SRS Labs, Inc. of Santa Ana, Calif.

As with bass management, though, the setup of an audio system utilizing PBE algorithms is static, with a fixed cross-over frequency or region where real low frequencies are filtered out and replaced with the synthesized harmonics. The same problem occurs in that the ideal crossover frequency is different for quiet, normal, and loud listening levels.

SUMMARY OF THE INVENTION

In one embodiment of the present invention, a method of providing level dependent low frequency management in a signal processing system includes receiving an audio input signal associated with at least a first speaker, wherein the first speaker attenuates signals in a low frequency range. The method also includes boosting components of the audio input signal in the low frequency range by an amount sufficient to at least partially compensate for low frequency attenuation of the first speaker without exceeding one or more acceptable limitations of the signal processing system and processing the audio input signal using an alternate low frequency management solution if a low frequency level of the audio input signal and one or more limitations of the signal processing system restrict boosting the low frequencies to substantially compensate for the low frequency attenuation of the first speaker.

In another embodiment of the present invention, a signal processing system to provide audio input signal level dependent bass frequency management includes an input to receive an audio input signal associated with at least a first speaker and a level dependent bass frequency management system. The level dependent bass frequency management system includes a level detector responsive to a level of the audio input signal and an amplifier stem. The level dependent bass frequency management system also includes control logic to cause the amplifier to boost components of the audio input signal in the low frequency range by an amount sufficient to at least partially compensate for low frequency attenuation of the first speaker without exceeding one or more acceptable limitations of the signal processing system and to cause the level dependent bass frequency management system to process the audio input signal using an alternate low frequency management solution if a low frequency level of the audio input signal and one or more limitations of the signal processing system restrict boosting the low frequencies to substantially compensate for the low frequency attenuation of the first speaker.

In a further embodiment of the present invention, a signal processing system includes an audio input signal level dependent bass frequency management system. The level dependent bass frequency management system includes an input to receive an audio input signal associated with at least a first audio output device and an equalizer. The level dependent bass frequency management system also includes control logic, coupled to the input, to (i) cause the equalizer to boost the frequency component of the audio input signal to at least partially compensate for the attenuated frequency response if the audio input signal includes a frequency component having a level at or below a first level and having a frequency that resides in an attenuated, low frequency response region of the first audio output device and (ii) process the frequency component of the audio input signal using an alternate low frequency management solution if the frequency component has a level greater than the first level and boosting the frequency component to substantially compensate for the attenuated frequency response is restricted by one or more limitations of the signal processing system.

In a further embodiment of the present invention, an apparatus to provide audio input signal level dependent bass frequency management includes means for receiving an audio input signal associated with at least a first speaker, wherein the first speaker attenuates signals in a low frequency range. The apparatus also includes means for boosting components of the audio input signal in the low frequency range by an amount sufficient to at least partially compensate for low frequency attenuation of the first speaker without exceeding one or more acceptable limitations of the signal processing system. The apparatus also includes means for processing the audio input signal using an alternate low frequency management solution if a low frequency level of the audio input signal and one or more limitations of the signal processing system restrict boosting the low frequencies to substantially compensate for the low frequency attenuation of the first speaker.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
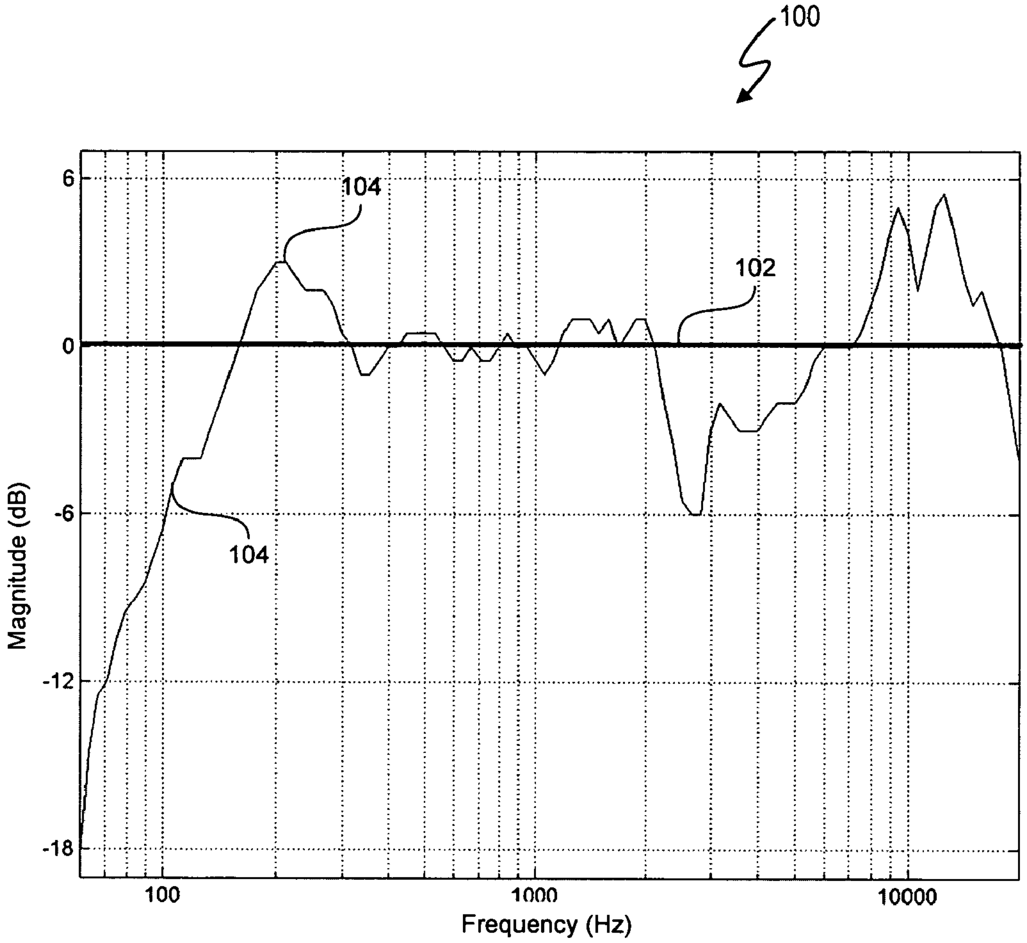
Figure 1 (prior art)
FIG. 1 (labeled prior art) depicts a magnitude frequency response of an example non-ideal speaker and of an ideal speaker.
Figure 2:
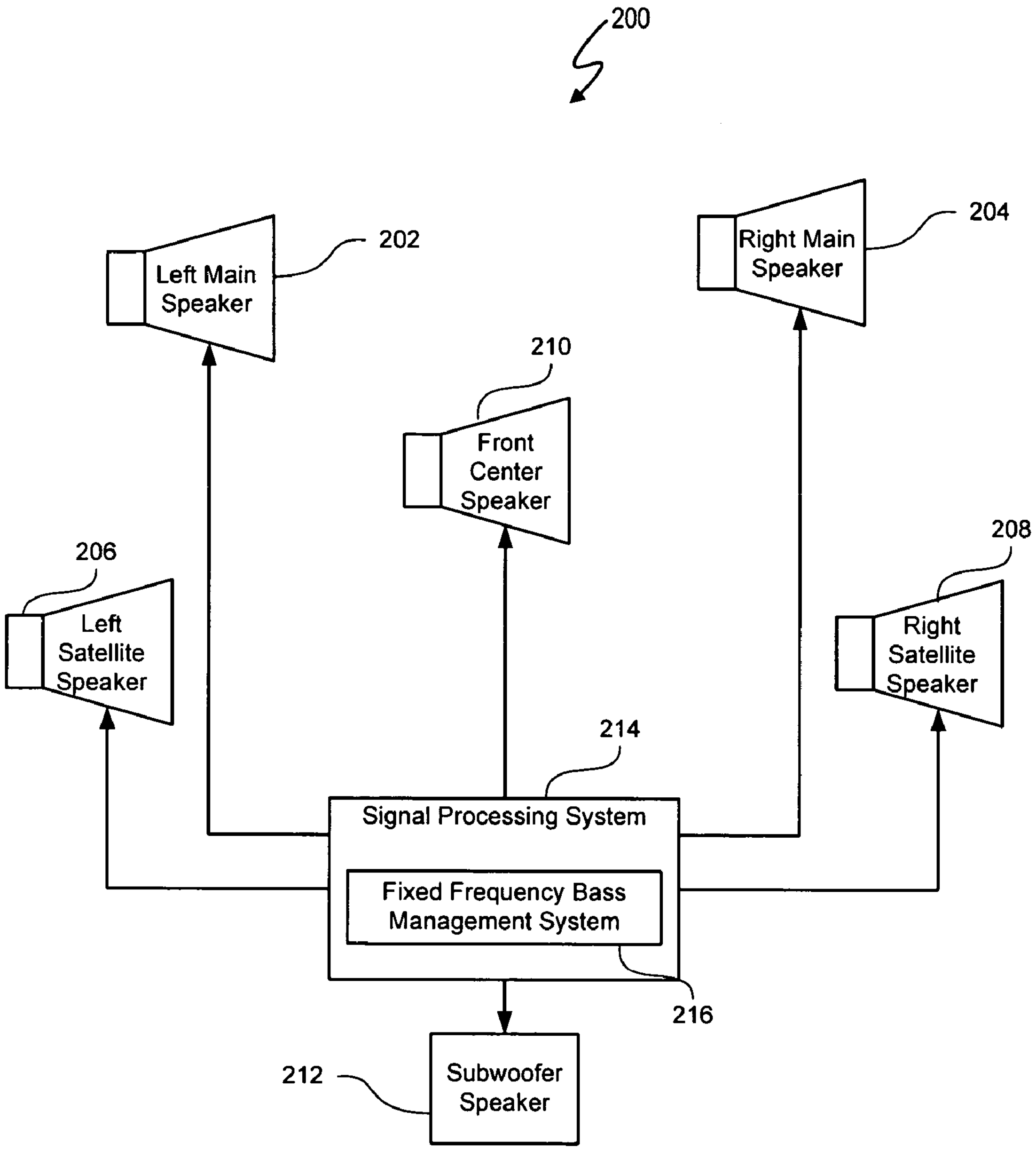
Figure 2 (prior art)
FIG. 2 (labeled prior art) depicts an audio system with a fixed frequency bass management process.

A signal processing system includes a level dependent bass management system. Thus, rather than incorporating a bass management system with a fixed solution for all audio input signal levels, the level dependent bass management system utilizes audio input signal level information to apply at least one of multiple, available bass management solutions to generate one or more output signals from the audio input signal. In at least one embodiment, initially, the level dependent bass management system boosts components of the audio input signal in the low frequency range by an amount sufficient to at least partially compensate for low frequency attenuation of the first speaker without exceeding one or more acceptable limitations of the signal processing system. If boosting alone cannot completely compensate for low frequency attenuation of the first speaker without exceeding one or more acceptable limitations of the signal processing system, the level dependent bass management system processes the audio input signal using an alternate low frequency management solution.

In at least one embodiment, the alternative low frequency management solution includes any combination of (1) equalization via gain adjustments, (2) route of low frequency signals to speakers that have a better low frequency response than an intended speaker, and (3) utilization of psycho-acoustic bass extension algorithms.

The level dependent bass management system applies the appropriate bass management solution based upon the level of the audio input signal and known (or at least estimated) characteristics of speakers in an audio system. For example, if an audio signal includes a low frequency component intended for speaker A and speaker A has a non-flat, attenuated frequency response range that encompasses the low frequency component, the level dependent bass management system can determine if the audio input signal level is low enough to apply an equalization solution to the low frequency component to boost the gain of the low frequency component to achieve a flatter frequency response. The level dependent bass management system can boost the gain of the audio input signal until reaching the limitations of the audio system.

The limitations of the audio system include, as described above, exceeding the capabilities of one or more audio system components, such as the power supply, digital-to-analog converters, and amplifiers. Upon reaching the limitations of the audio system, the level dependent bass management system can select one or more alternate bass management solutions or combine one or more alternate bass management solutions with the equalization bass management solution. If the level of the audio input signal is initially too high, the audio system may not have the capability to boost the audio input signal in the first instance, and the level dependent bass management system initially selects from a non-equalization bass management solution.

If increasing the gain of the audio input signal is not possible or is insufficient to completely compensate for the non-flat, attenuated frequency response of speaker A, the level dependent bass management system, for example, routes low frequency components to one or more other speakers that have better low frequency response and/or the level dependent bass frequency management system can apply sound enhancing technology, such as PBE algorithms, to compensate for poor low frequency speaker performance, e.g. low gain and/or unacceptable frequency response, and, thus, enhance the sound quality of the speakers. The level dependent bass management system attempts to preserve the audio input signal level. So, in at least one embodiment, the overall level of the low frequency audio input signal preferably remains the same regardless of which bass management solution of combination of bass management solutions the level dependent bass management system selects. Additionally, when routing low frequency signals to other speakers, the level dependent bass management system attempts to preserve directionality and balance. For example, if left channel low frequency audio input signal components are routed, the level dependent bass management system will preferably route the low frequency signal components to another left speaker to maintain direction and will route complimentary right channel low frequency components to a right speaker corresponding to the left speaker to maintain balance. In at least one embodiment, if directionality cannot be maintained, the left channel and complimentary right channel audio input signals would both be routed to a speaker with a flat low frequency response such as a subwoofer.

Figure 3:
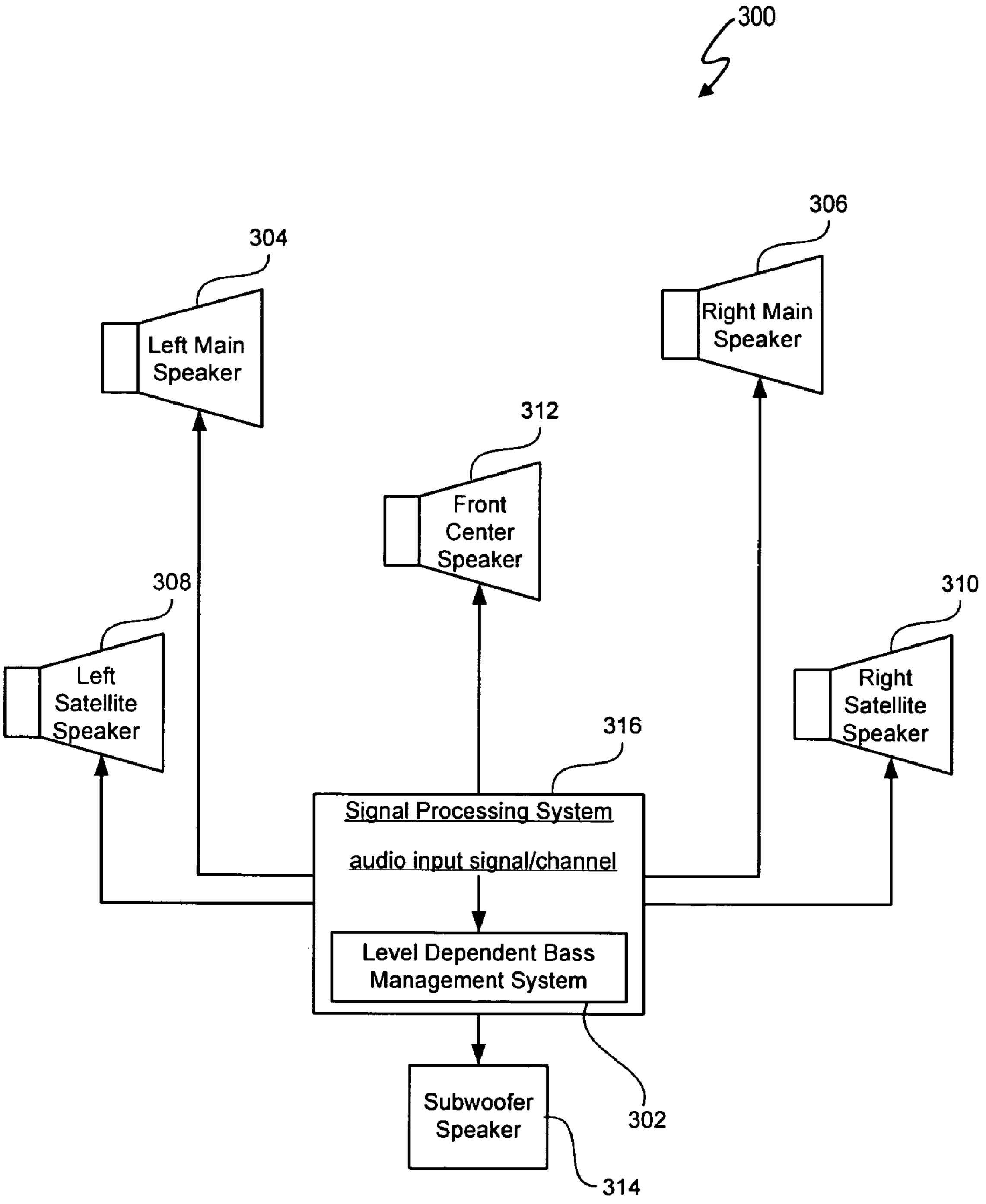
FIG. 3 depicts an audio system with a level dependent bass management system.

FIG. 3 depicts an audio system 300 with a level dependent bass management system 302. The audio system 300 is configured with a 5:1 speaker configuration consisting of left main speaker 304, a right main speaker 306, a left satellite speaker 308, a right satellite speaker 310, front center speaker 312, and subwoofer speaker 314. In other embodiments, audio system 300 can be configured with any other speaker configuration such as a 7:1 speaker configuration, a four (4) speaker configuration (e.g. a 5:1 speaker configuration without center or subwoofer speakers), or a two (2) speaker configuration with only left and right channels for left and right speakers.

Audio system 300 also includes a signal processing system 316. The signal processing system 316 represents any system, such as a television, stereo, digital versatile disk player, home theater system, and video cassette recorder, which processes audio signals. Each speaker of the audio system 300 is generally allocated a channel, and each channel generally is processed as a separate audio input signal. An audio output signal used to drive a speaker is generated for each channel from the audio input signal. Thus, the audio output signal for a channel is a function of the corresponding audio input signal for the channel. Processing of the audio input signal affects the corresponding audio output signal and, thus, the sound output of the corresponding speaker.

The level dependent bass management system 302 modifies audio input signals based on the level of the audio input signal for one or more speakers to obtain better sound reproduction by the speakers of audio system 300. When an audio input signal includes bass frequencies at a level that are within an attenuated portion of the frequency response of a speaker, the level dependent bass management system 302 applies a bass management solution, processes the audio input signal in accordance with the bass management solution, and generates an output signal that, in at least one embodiment, maintains the directionality (sound origination) intended by the audio input signal, maintains channel balance, maintains the signal output level intended by the audio input signal, and produces a substantially flat low frequency response.

Each bass management solution includes one or more bass frequency management solutions based on a level of the audio input signal level to appropriately generate one or more audio out signals with the intent of preserving the content of the audio input signal. The application of a particular bass management solution for processing the audio input signal depends upon the level of the audio input signal and whether frequency components of the audio input signal are within an unacceptable frequency response range of the speaker. In at least one embodiment, the level dependent bass management system includes three different bass managements solutions that can be used separately or in any combination, namely (1) equalization via gain adjustments, (2) route of low frequency signals to speakers that have a better low frequency response than an intended speaker, and (3) utilization of psycho-acoustic bass extension algorithms.

In at least one embodiment, the level dependent bass management system 302 applies a bass management solution based on at least a level of the audio input signal and a frequency response of an intended speaker to minimize distortion and, if possible, preserve sound origination intent and sound balance. The level dependent bass management system 302 can also utilize system gain data of audio system 300 to more accurately determine the appropriate bass management solution. Additionally, the level dependent bass management system 302 can partially base generation of an audio output signal on an overall peak level of the audio input signal, and/or the level dependent bass management system 302 can base generation of an audio output signal on signal levels for particular frequencies.

Figure 4:
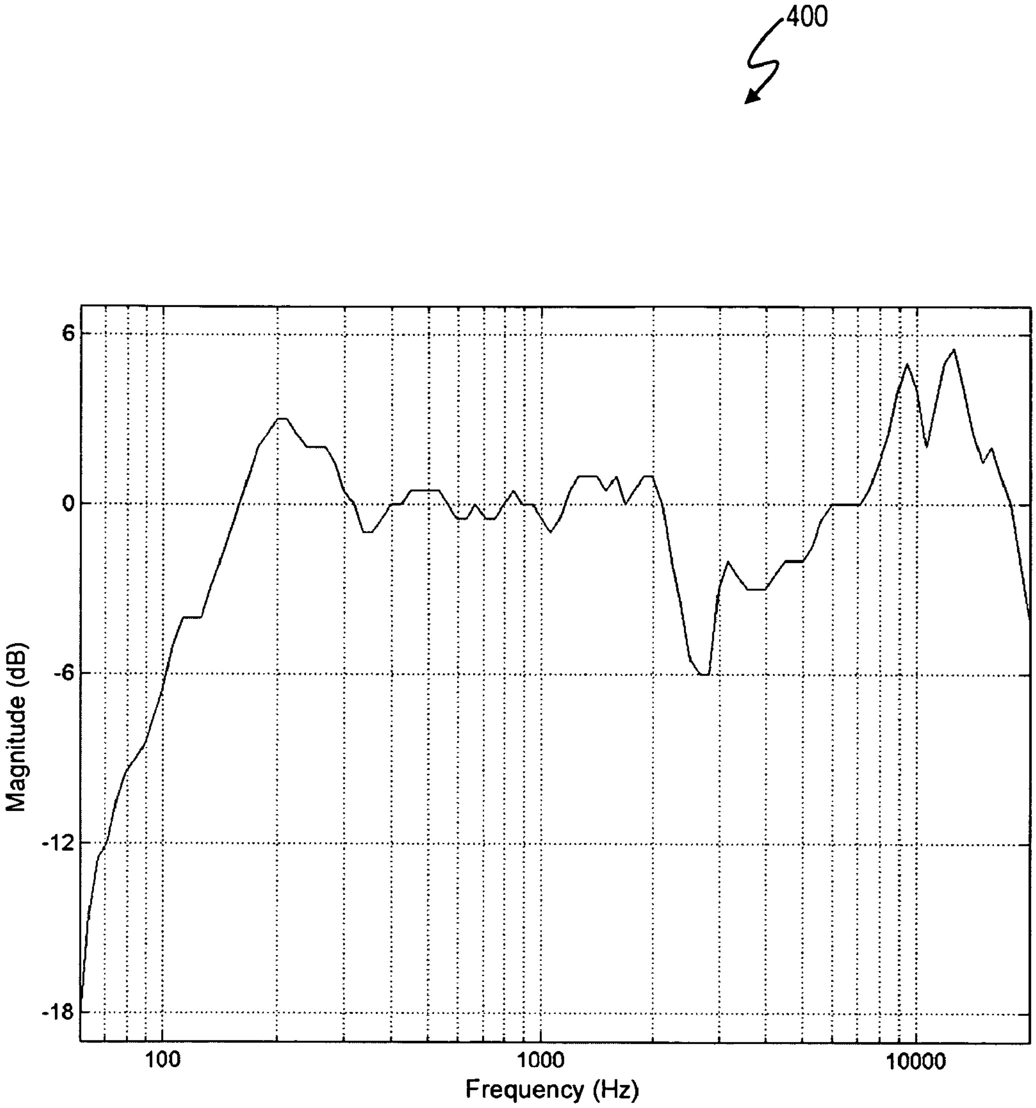
FIG. 4 depicts a speaker frequency response plot.

The level dependent bass management system 302 utilizes the audio input signal level and frequency response of a speaker when modifying an audio input signal. Referring to FIG. 4, the frequency response plot 400 of a typical low- to mid-end speaker demonstrates that the frequency response of the speaker is not flat over the entire human perceptible audio frequency range. The frequency response plot is substantially flatter in the 300 Hz to 2,000 Hz frequency range with relatively minor distortion in the 2,000 Hz to 20,000 Hz frequency range. In a low frequency range from 0 Hz to 200 Hz, the frequency response of the speaker decreases significantly as frequency decreases. In the low frequency range from 0 Hz to 200 Hz, the level of the audio output signal can be boosted using, for example, an equalizer circuit to compensate for the lost gain by the speaker as long as the limitations of the audio system are not exceeded. For example, sound distortion in typical low- to mid-end speakers is also a function of the audio output signal level. Thus, level dependent sound distortion limits the amount of gain boost, if any, available to compensate for the lost gain. Additionally, boosting the gain of an output signal may require more power than is available or may result in overheating components of the audio system 300.

Figure 5A:
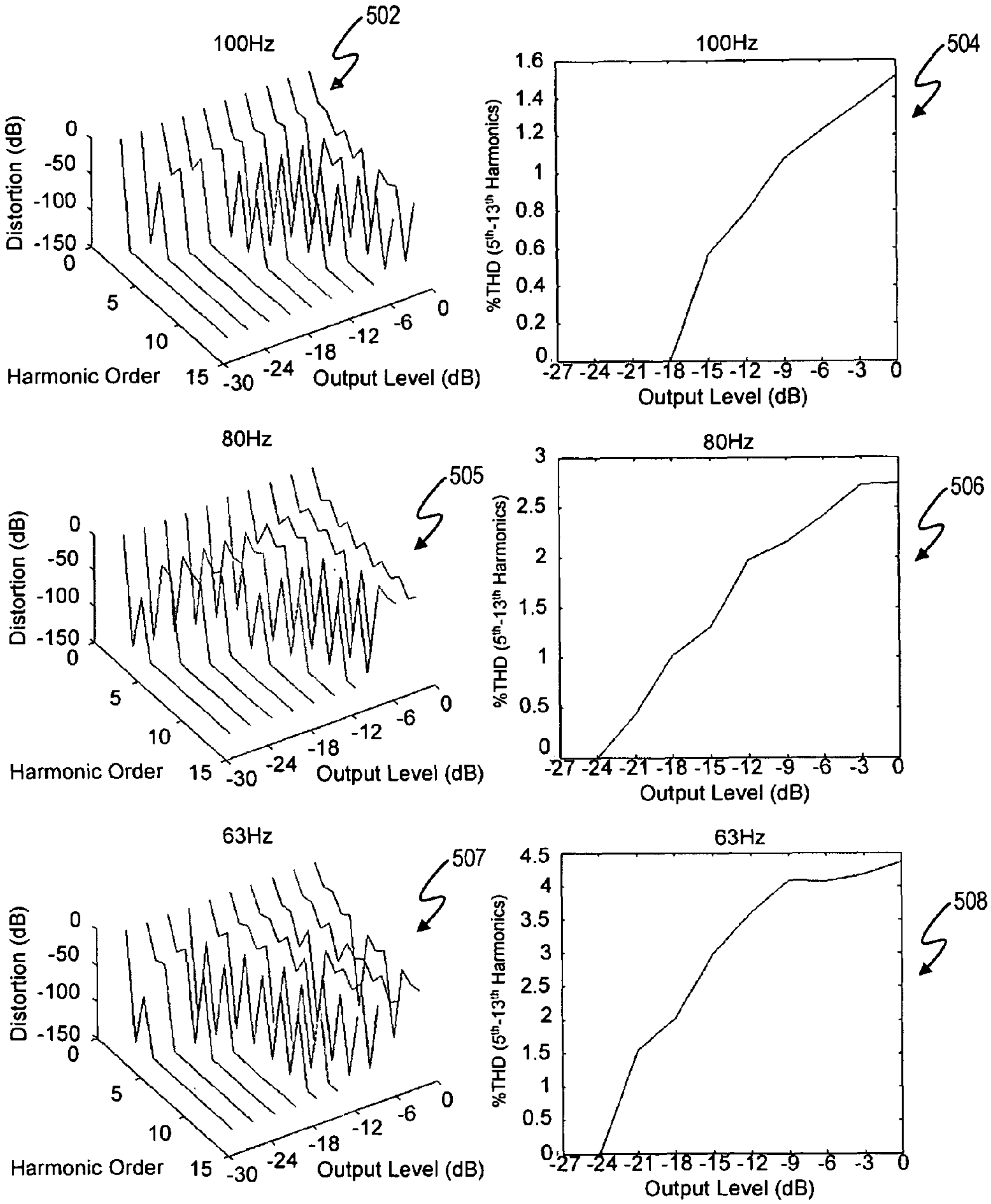
FIGS. 5A, 5B, and 5C (collectively "FIG. 5") depict total harmonic distortion levels of a speaker for various frequencies and gains.
Figure 5B:
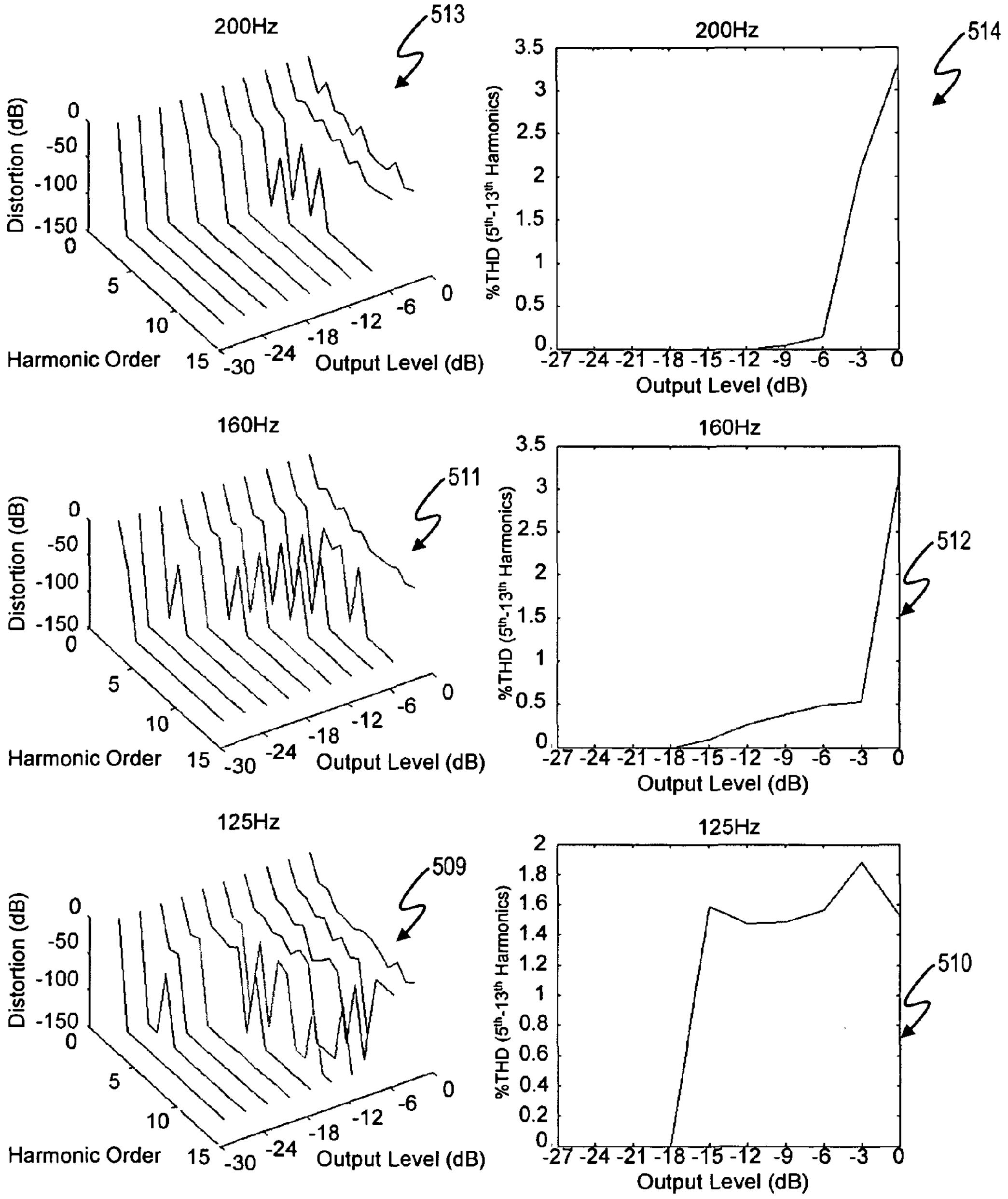
Figure 5C:
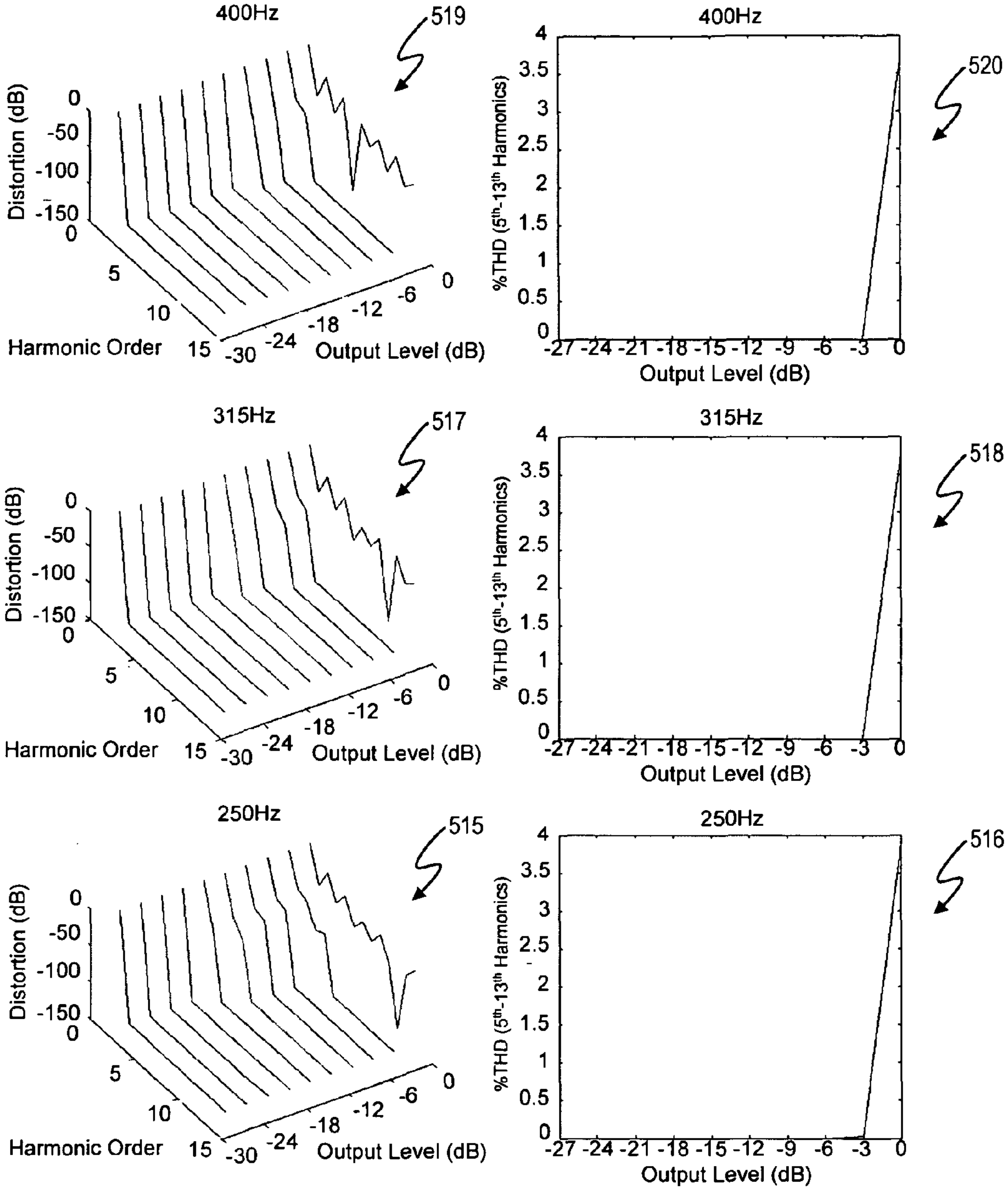

Referring to FIGS. 5A, 5B, and 5C (collectively "FIG. 5"), total harmonic distortion ("THD") of a speaker is a function of the level of the audio input signal associated with the speaker and a function of the frequencies of the audio input signal. FIG. 5 depicts nine (9) pairs of side-by-side plots. The plots in FIG. 5 are for the same speaker as the frequency response plot in FIG. 4. Plots 502 and 504 both show the harmonic frequency responses for the first twelve (12) harmonics of a speaker to a sine wave at ten (10) different output levels, normalized to the frequency response at the fundamental frequency of 100 Hz. Plots 502 and 504 are normalized so that the fundamental frequency response is 0 dB. Plot 504 depicts the THD percentage versus sound output level of the speaker. THD is defined as a percentage of the power sum of all the harmonics to the power sum of all the harmonics plus the fundamental (i.e. amplitude normalization). An equation for THD is set forth in Equation 1:

$$\% THD = 100 \times \frac{\sqrt{H2^2 + H3^2 + \ldots + Hn^2}}{\sqrt{H1^2 + H2^2 + H3^2 + \ldots + Hn^2}}, \quad [1]$$

where Hn=Harmonic response of Nth harmonic and H1=Fundamental response. The THD of plot 504 only takes into consideration the $5^{th}$-$13^{th}$ harmonics (H5-H13) in order to better depict the onset of distortion due to speaker overload. From the frequency response plots 502 and 504, at 100 Hz as the output level increases past −18 dB, the THD of the speaker increases and reaches a maximum THD at the maximum level of 0 dB. All of the frequency plots 505-520 of FIG. 5 are interpreted in the same manner as frequency plots 502 and 504. Thus, plots 504-520 indicate that at 250 Hz and above, the THD of the speakers is very low below a −3 dB speaker output level. Above −3 dB, the speakers perform poorly due to the dramatically increasing THD. However, as frequencies drop below 250 Hz, the speakers begin to perform poorly at relatively low output levels.

Figure 6:
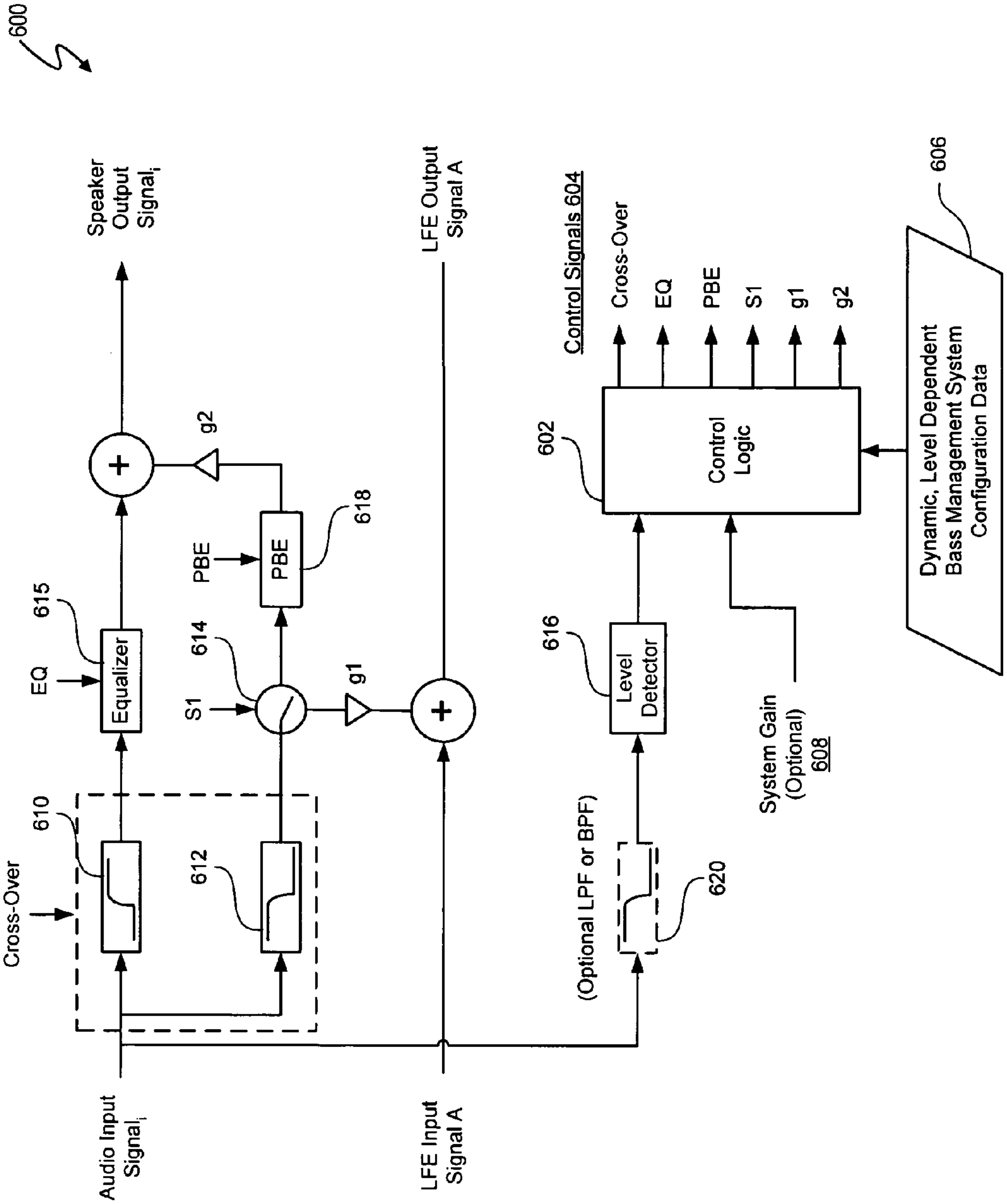
FIG. 6 depicts a level dependent bass management system.
Figure 7:
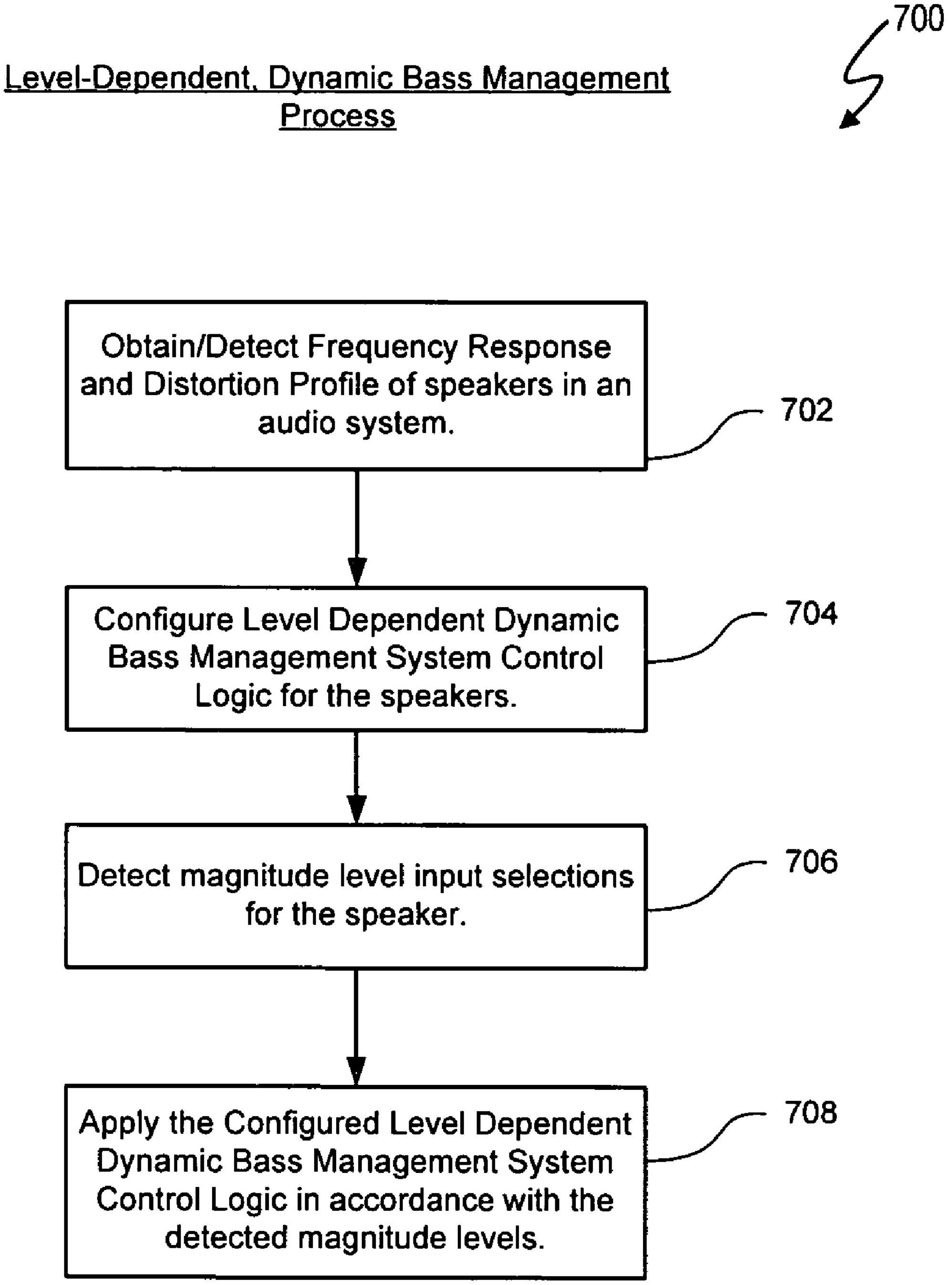
FIG. 7 depicts a level dependent bass management process.

FIG. 6 depicts one embodiment of a level dependent bass management system 600 such as level dependent bass management system 302. In at least one embodiment, the level dependent bass management system 600 operates in accordance with the level dependent bass management process 700 depicted in FIG. 7. The level dependent bass management system 600 includes control logic 602 to generate control signals that provide level dependent bass management for audio system 300. To provide the proper control signals, operation 702 obtains or detects the frequency response and distortion profile of each speaker or selected speakers in the signal processing system 316. Additionally, operation 702 can also obtain or detect data related to other limitations of audio system 300 such as available power, clipping data for components such as any digital-to-analog converter, and temperature limitations. The frequency responses, distortion profiles, and operational limitation data can be obtained, for example, from factory information and stored as data in the audio system 300. In another embodiment, the signal processing system 316 detects the speakers in audio system 300 and determines the frequency responses and distortion profiles for at least those speakers whose input signals will be affected by level dependent bass management system 600. Detecting the speakers in audio system 300 and determining the frequency responses and distortion profiles can be accomplished, for example, on the occurrence of a predetermined event such as when the audio system 300 is turned 'on'.

Operation 704 configures the control logic 602 to provide the proper control signals 604. In at least one embodiment, the control logic 602 is configured with the goal of generating a flat (0 dB) frequency response at the speaker, preventing distortion of sound by the speaker, and preserving sound origination directionality. In one embodiment, control logic

602 includes a processor that accesses configuration data 606 to determine control signals 604. In another embodiment, control logic 602 is configured in accordance with the configuration data 606 using hard-wired circuitry, programmable logic, or other technology or combination thereof.

The control logic generates the control signals 604 based on data that includes the audio input signal level. A level detector 616 detects the level of the audio input signal. Preferably, a low pass filter or band pass filter 620 prefilters the audio input signal so that the level detector 616 detects the level of only the filtered signal. The low pass filter cut-off frequency is preferably set to a frequency that passes frequencies that may cause an attenuated low frequency response by the speakers. If it is known that some frequencies will automatically be removed from a speaker output signal, a band-pass filter can be used so that the control logic only processes the signal band of interest. In at least one embodiment, the level detector 616 detects the average level of the audio input signal over a predetermined period of time. The predetermined period of time can be set to allow the control logic 602 adequate response time to provide level dependent bass management. The system gain 608 can also be used by control logic 602 to provide better bass management. In at least one embodiment, the system gain 608 represents the volume level of the audio system 300. In another embodiment, the system gain 608 also includes any post-processing amplification.

The level dependent bass management system 600 processes an audio input signal for each pre-identified speaker. In at least one embodiment, the pre-identified speakers are the speakers that will benefit from bass management and/or are used by the level dependent bass management system 600 to provide bass management. In one embodiment, the pre-identified speakers are all the speakers in audio system 300. Audio input $\text{signal}_i$ represents the audio input signal level for the $i^{th}$ speaker, where "i" is a member of the set of all pre-identified speakers that may have non-ideal low frequency responses. A high pass filter 610 and a low pass filter 612 filter the audio input signals. The cut-off frequency of the high pass filter 610 and a low pass filter 612 is set by the cross-over signal.

The cross-over signal sets the cut-off frequency of the filters 610 and 612 to a determined cross-over frequency. The control logic determines if the signal above the cross-over signal can be boosted without exceeding any component capabilities of the audio system 300. If the $\text{signal}_i$ can be boosted above the cross-over frequency, the audio input signal is boosted by the equalizer 615 in accordance with the bass equalizer control signal EQ. The bass equalizer control signal EQ controls the low frequency (e.g. 0-200 Hz) boost of the audio input signal and attempts to maintain a flat frequency response of the $i^{th}$ speaker. If a flat frequency response cannot be achieved by boosting the gain of the audio input signal;, the control logic 602 applies another bass management solution to achieve a flat frequency response for the overall intended level of the output signal while attempting to maintain directionality and balance. Audio input signals below the cross-over frequency are, thus, either (i) enhanced using a PBE algorithm 618 and added to the audio input signal or (ii) added to the low frequency encoding (LFE) input signal if a low frequency capable speaker is available that can produce the sounds without distortion, such as a subwoofer. In one embodiment (as shown), the input signal for the low frequency capable speaker is the LFE channel for a subwoofer. In another embodiment, if a speaker with directionality, such as left and right main speakers, is available, the level dependent bass management system 600 can attempt to preserve directionality by adding the low frequency signal to the output signal of the main speaker that will preserve directionality. The switch 614 operates in accordance with control signal S1 to control whether a PBE algorithm 618 will be used or whether the signal frequencies below the cross-over frequency will be routed to another speaker. The gains g1 and g2 are a matter of design choice and control how much gain to apply to the PBE algorithm generated signal and the signal routed to the LFE speaker.

Additionally, the level dependent bass management system 600 attempts to maintain balance in the audio system 300. The level dependent bass management system 600 maintains balance in the audio system 300 by applying the same bass management solution for complimentary channels. For example, if left channel low frequency audio input signal components are routed, the level dependent bass management system will preferably route the low frequency signal components to another left speaker to maintain direction and will route complimentary right channel low frequency components to a right speaker corresponding to the left speaker. If directionality cannot be maintained, the left channel and complimentary right channel audio input signals would be both be routed to a speaker with a flat low frequency response such as a subwoofer.

In operation 706, level detector 616 detects the level of the audio input $\text{signal}_i$. In operation 708, the control logic uses the configuration data 606 and the detected level of the audio input signal to generate the appropriate control signals 604. The configuration data 606 represents knowledge included in the frequency response plot 400 and frequency plots 502-520. From frequency plots 502-520, the THD of the speaker specific frequencies and speaker output levels can be determined. From the frequency response plot 400, gain of the speaker over the audible frequency range can be determined. Using the data from FIGS. 4 and 5, the audio input signal level, and, optionally, the system gain, an unacceptable frequency range can be determined and a cross-over frequency determined. For example, if for a given frequency, the audio input signal level for the $i^{th}$ speaker plus the system gain plus the speaker gain for the $i^{th}$ speaker is within an area of unacceptable THD, the cross-over frequency is set above the given frequency. The cross-over frequency is preferably set so that the speakers in the audio system 300 avoid distortion, preserves directionality, and obtains a substantially flat frequency response.

Table 1 represents example control signal data EQ and Cross-Over for an average peak audio input signal and example system gain. In the first example, the total signal gain is −24 dB. From plot 504, at 100 Hz the gain of the total signal gain at 100 Hz can be increased using equalizer 615 by +6 dB to compensate for the −6 dB loss in gain by the speaker as indicated in frequency response plot 400. The frequency response for frequencies at or below about 90 Hz is unacceptable because of the sharp gain decline at the speaker and because of the onset of THD. Routing or PBE enhancing the <90 Hz frequencies will not adversely impact directionality. In the third example, the total signal gain is −18 dB. From FIG. 5, at −18 dB the onset of THD begins with a steep increase for frequencies below 150 Hz. So, the cross-over frequency is set to 150 Hz. Frequency response plot 400 indicates a flat frequency response for bass frequencies, so no bass equalization compensation is needed. Explanations of the remaining examples follow the same methodology. Thus, by using level dependent bass management, the audio system 300 avoids distortion, preserve directionality, and obtain a substantially flat frequency response.

TABLE 1

| Average Peak Input Signal (dBFS) | System Gain (dB)* | Total Signal Gain (dB)* | EQ (dB) | Cross-Over frequency (Hz) | Notes |
|---|---|---|---|---|---|
| ≦−18 | −6 | −24 | +6 @ 100 Hz | 90 | All directionality preserved since speaker is completely handling frequencies >= 100 Hz. |
| −15 | −6 | −21 | +4 @ 125 Hz | 100 | |
| −12 | −6 | −18 | None | 150 | |
| −6 | −6 | −12 | None | 175 | |
| 0 | −6 | −6 | None | 225 | Directionality seriously compromised, but speaker is safe from overload damage. |

Figure 8:
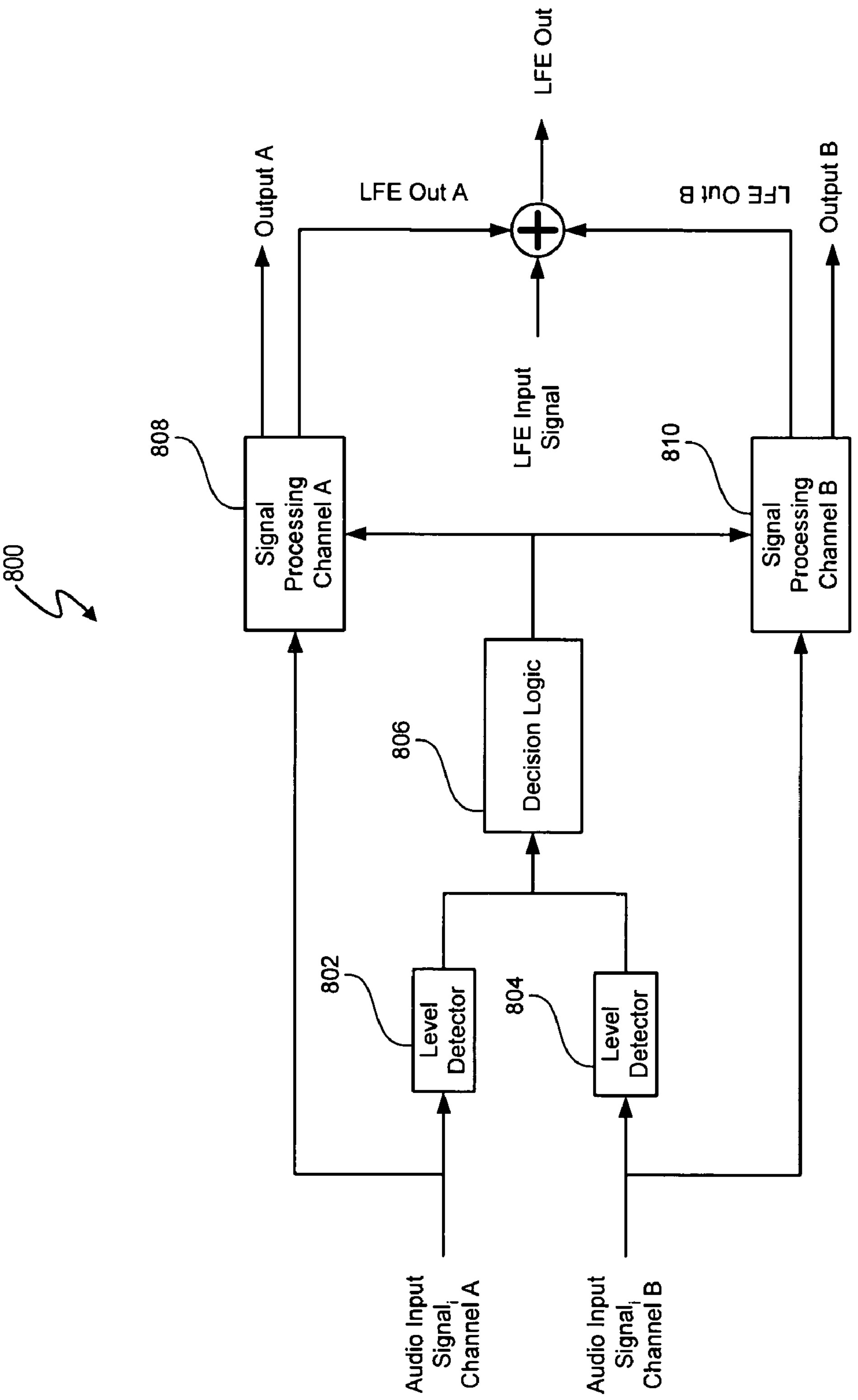
FIG. 8 depicts a level dependent bass management system with directionality and balance preservation components.

Referring to FIG. 8, the level dependent bass management system 800 depicts one embodiment of a system that maintains balance between two audio signal channels during level dependent bass management operations. The same technique can be extended to maintain balance among any number of channels. Level detector 802 detects the signal level of audio input signals channel A ("channel A"), and level detector 804 detects the signal level of audio input signals channel B ("channel B"). In at least one embodiment, level detectors 802 and 804 function identically to level detector 616. A filter (not shown), such as a low pass filter, can be used to prefilter audio input signals, channels A and B so that level detectors 802 and 804 detect the level of a frequency range of interest, such as a low frequency range. In at least one embodiment, channels A and B represent complimentary channels, such as respective left and right audio channels.

Decision logic 806 receives level information determined by level detectors 802 and 804. In one embodiment, decision logic 806 determines which of channels A and B has the maximum signal level. Decision logic 806 utilizes this determination to instruct signal processing channel A component 808 and signal processing channel B component 810 to process channels A and B identically in accordance with the maximum detected signal level. Signal processing channel A and B components 808 and 810 are essentially identical to level dependent bass management system 600. However, rather than individually detecting the signal levels of channels A and B, the maximum signal level determined by decision logic 806 is used as an input to control logic 602.

Signal processing channel A and B components 808 and 810 generate individual Output A and B signals that, in at least one embodiment, are provided to drive individual speakers. If a low frequency signal is boosted to compensate for low frequency attenuation by an output device, such as a speaker, the signal processing channel A and B components 808 and 810 also generate signals in accordance with another bass management solution. In one embodiment, signal processing channel A and B components 808 and 810 each generate respective LFE out signals A and B. The LFE out signals compensate for loss of low signal frequency response in the Output A and B signals. Since generally there is only one LFE output device, such as a subwoofer, the LFE out A and B signals are mixed (e.g. summed) with the LFE input signal originally intended for the LFE device to generate the LFE Out signal. The LFE Out signal is provided to a low frequency output device, such as the subwoofer.

The level dependent bass management system 800 can be implemented in hardware, software, or a combination of hardware and software. If processing speeds are sufficient, level dependent bass management system 800 can be implemented with only one signal processing component and time division can be used to process channels A and B.

Thus, level dependent bass management system of the signal processing system is in at least one embodiment designed to generate a flat frequency response for low frequencies, prevent distortion by audio output devices, and maintain sound directionality.

Although the present invention has been described in detail, it should be understood that various changes, substitutions and alterations can be made hereto without departing from the spirit and scope of the invention as defined by the appended claims.

What is claimed is:

1. A method of providing level dependent low frequency management in a signal processing system, the method comprising:

receiving an audio input signal associated with at least a first speaker, wherein the first speaker attenuates signals in a low frequency range;

detecting a low frequency level of the audio input signal;

boosting components of the audio input signal in the low frequency range by an amount sufficient to at least partially compensate for low frequency attenuation of the first speaker without exceeding one or more acceptable limitations of the signal processing system;

determining if the detected low frequency level of the audio input signal and one or more limitations of the signal processing system restrict boosting the low frequencies to substantially compensate for the low frequency attenuation of the first speaker to make a restricted boosting determination;

selecting an alternate low frequency management solution upon making the restricted boosting determination; and after selection of the alternate low frequency management solution, processing the audio input signal using the selected alternate low frequency management solution.

2. The method of claim 1 wherein the alternate low frequency management solution comprises:

processing the components of the audio input signal in the low frequency range to generate a signal for routing to a second speaker.

3. The method of claim 2 wherein components of the audio input signal are boosted to a first level, the signal for routing to the second speaker has a second level, and the sum of the first and second levels equals a level of the audio input signal in the low frequency range.

4. The method of claim 1 wherein the alternate low frequency management solution comprises:

applying a psycho-acoustic bass extension algorithm to frequency components of the audio input signal in the unacceptable frequency response range of the first speaker for the level of the audio input signal.

5. The method of claim 1 wherein the alternate low frequency management solution comprises one or more members of the group comprising:

(i) processing the components of the audio input signal in the low frequency range to generate an output signal for routing to a second speaker;

(ii) applying a psycho-acoustic bass extension algorithm to frequency components of the audio input signal in the unacceptable frequency response range of the first speaker for the level of the audio input signal; and (iii) continued boosting of components of the audio input signal in the low frequency range by an amount sufficient to at least partially compensate for low frequency attenuation of the first speaker without exceeding one or more acceptable limitations of the signal processing system.

6. The method of claim 1 wherein the low frequency level of the audio input signal comprises an average peak level over a predetermined period of time.

7. The method of claim 1 wherein the low frequency level of the audio input signal comprises a collection of audio input signal levels for respective frequency components of the audio input signal.

8. The method of claim 1 wherein boosting components of the audio input signal in the low frequency range further comprises:

increasing a gain of the audio input signal only by an amount that preserves a substantially flat frequency response of the first speaker.

9. The method of claim 1 further comprising:

filtering the audio input signal using a high pass filter and a low pass filter, wherein the cut-off frequency of the high pass filter and the cut-off frequency of the low pass filter depend upon the low frequency level of the audio input signal, and the cut-off frequency of the low pass filter defines the upper frequency of the low frequency range.

10. The method of claim 1 further comprising:

predetermining acceptable limitations of the signal processing system for a plurality of low frequency levels of the audio input signal.

11. The method of claim 1 further comprising:

substantially preserving directionality and balance of the audio input signal during boosting and processing.

12. The method of claim 11 wherein substantially preserving directionality and balance of the audio input signal during boosting and processing comprises:

determining a maximum signal level between two complimentary audio signal channels; and using the maximum signal level as the low frequency level of the audio input signal when boosting and processing the two complimentary audio signal channels of the audio input signal.

13. A signal processing system to provide audio input signal level dependent bass frequency management, the system comprising:

an input to receive an audio input signal associated with at least a first speaker; and a level dependent bass frequency management system comprising:

a level detector responsive to a level of the audio input signal;

an amplifier; and control logic to:

cause the amplifier to boost components of the audio input signal in the low frequency range by an amount sufficient to at least partially compensate for low frequency attenuation of the first speaker without exceeding one or more acceptable limitations of the signal processing system;

determine if the low frequency level of the audio input signal and one or more limitations of the signal processing system restrict boosting the low frequencies to substantially compensate for the low frequency attenuation of the first speaker to make a restricted boosting determination;

select an alternate low frequency management solution upon making the restricted boosting determination; and after selection of the alternate low frequency management solution, cause the level dependent bass frequency management system to process the audio input signal using the selected alternate low frequency management solution.

14. The system of 13 wherein the alternate low frequency management solution comprises one or more components to process the audio input signal in the low frequency range to generate a signal for routing to a second speaker.

15. The system of 13 wherein the alternate low frequency management solution comprises one or more components to apply a psycho-acoustic bass extension algorithm to frequency components of the audio input signal in the unacceptable frequency response range of the first speaker for the level of the audio input signal.

16. The system of 13 wherein the alternate low frequency management solution comprises one or more components to perform one or more processes of the group comprising:

(i) process the components of the audio input signal in the low frequency range to generate an output signal for routing to a second speaker;

(ii) apply a psycho-acoustic bass extension algorithm to frequency components of the audio input signal in the unacceptable frequency response range of the first speaker for the level of the audio input signal; and (iii) continued boost of components of the audio input signal in the low frequency range by an amount sufficient to at least partially compensate for low frequency attenuation of the first speaker without exceeding one or more acceptable limitations of the signal processing system.

17. The system of 13 wherein the level dependent bass frequency management system is implemented using at least one member of the group comprising: software, hard-wired circuitry, and programmable logic.

18. The system of claim 13 wherein the low frequency level of the audio input signal comprises an average peak level over a predetermined period of time.

19. The system of claim 13 wherein the low frequency level of the audio input signal comprises a collection of audio input signal levels for respective frequency components of the audio input signal.

20. The system of claim 13 wherein to boost components of the audio input signal in the low frequency range, the level dependent bass frequency management system boosts the level of the audio input signal in the low frequency range by increasing the gain of the audio input signal up to an amount that generates a substantially flat frequency response of the speaker.

21. The system of claim 13 further comprising:

a high pass filter to receive the audio input signal; and a low pass filter to receive the audio input signal, wherein a cut-off frequency of the high pass filter and a cut-off frequency of the low pass filter depend upon the low frequency level of the audio input signal, and the cut-off frequency of the low pass filter defines the upper frequency of the low frequency range.

22. The system of claim 13 wherein the level dependent bass frequency management system further comprises:

a memory coupled to the control logic and signal modification components and storing predetermined modifications of the audio input signal for a plurality of levels of the audio input signal.

23. The system of claim 13 wherein the control logic also substantially preserves directionality and balance of the audio input signal during boosting and processing.

24. The system of claim 23 further comprising:

another level detector, wherein the level detectors are responsive to respective, complimentary signal channel levels of the audio input signal;

decision logic for determining a maximum signal level between the respective complimentary audio signal channels;

wherein the control logic utilizes the maximum signal level as the low frequency level of the audio input signal when boosting and processing the two complimentary audio signal channels of the audio input signal.

25. A signal processing system comprising an audio input signal level dependent bass frequency management system, the level dependent bass frequency management system comprising:

an input to receive an audio input signal associated with at least a first audio output device;

an equalizer; and control logic, coupled to the input, to:

(i) cause the equalizer to boost a frequency component of the audio input signal to at least partially compensate for an attenuated frequency response when the frequency component has a level at or below a first level and has a frequency that resides in an attenuated, low frequency response region of the first audio output device;

(ii) determine if the low frequency level of the audio input signal and one or more limitations of the signal processing system restrict boosting the low frequencies to substantially compensate for the low frequency attenuation of the first speaker to make a restricted boosting determination;

(iii) select an alternate low frequency management solution upon making the restricted boosting determination; and (iv) after selection of the alternate low frequency management solution, process the frequency component of the audio input signal using the selected alternate low frequency management solution.

26. The signal processing system of claim 25 further comprising:

a level detector to detect a level of the audio input signal to the level dependent bass frequency management system.

27. The signal processing system of claim 26 further comprising:

a bandpass filter coupled to the level detector to filter an audio signal to generate the audio input signal and provide the audio input signal to the level detector, wherein a frequency pass band of the bandpass filter is set to pass audio input signals that cause low frequency distortion in one or more of the audio output devices.

28. The signal processing system of claim 25 further comprising:

a high pass filter to receive the audio input signal; and a low pass filter to receive the audio input signal, wherein a cut-off frequency of the high pass filter and a cut-off frequency of the low pass filter depend upon the low frequency level of the audio input signal, and the cut-off frequency of the low pass filter defines the upper frequency of the low frequency range.

29. The signal processing system of claim 25 wherein the control logic further comprises a processor to process configuration data, wherein the configuration data is associated with multiple audio output devices of the signal processing system including the first audio output device, and the configuration data includes total harmonic distortion data for multiple signal levels and multiple signal frequencies.

30. The signal processing system of claim 25 wherein the control logic includes control signals to control the equalizer and the alternate low frequency management solution and the control signals include a cross-over frequency control signal that is representative of a cross-over frequency and an equalizer control signal to control a gain of the audio input signal, the level dependent bass frequency management system further comprising:

a high pass filter coupled to the control logic to receive the cross-over frequency control signal and to filter the audio input signal, wherein the cross-over frequency control signal sets a cut-off frequency of the high pass filter at a frequency that allows at least one of the audio output devices to produce a non-distorted sound; and an equalizer input coupled to the control logic to receive the equalizer control signal, wherein the equalizer is coupled to the high pass filter to receive an output of the high pass filter, and coupled to at least one of the audio output devices, wherein during operation the equalizer control signal causes the equalizer to boost the frequency component of the audio input signal.

31. The signal processing system of claim 25 wherein the alternate low frequency management solution includes a psycho-acoustic bass extension ("PBE") algorithm, the control logic includes control signals, and the control signals include a cross-over frequency control signal representative of a cross-over frequency and a PBE control signal to control the PBE algorithm, the level dependent bass frequency management system further comprising:

a low pass filter coupled to the control logic to receive the cross-over frequency control signal and to filter the audio input signal, wherein the cross-over frequency control signal sets a cut-off frequency of the low pass filter at a frequency that allows at least one of the audio output devices to produce a non-distorted sound in association with the PBE algorithm;

wherein the PBE algorithm is configured to enhance the audio input signal filtered by the low pass filter in accordance with the PBE control signal.

32. The signal processing system of claim 23 wherein the alternate low frequency management solution includes a psycho-acoustic bass extension ("PBE") algorithm, the control logic includes control signals, and the control signals include a cross-over frequency control signal representative of a cross-over frequency and a route control signal to control routing of certain signal frequencies intended for a first audio output device to one or more low frequency audio output devices, the level dependent bass frequency management system further comprising:

a low pass filter coupled to the control logic to receive the cross-over frequency control signal and to filter the audio input signal, wherein the cross-over frequency control signal sets a cut-off frequency of the low pass filter at a frequency to filter out signal frequencies intended for a first of the audio output devices; and circuitry coupled to the low pass filter that receives the route control signal and routes the certain signal frequencies intended for the first audio output device to the one or more low frequency audio output devices in accordance with the route control signal.

33. The signal processing system of claim 25 wherein the level of the audio input signal is an average level over a period of time.

34. The signal processing system of claim 25 wherein the control logic is implemented using one or more members of the group comprising hard-wired circuitry and programmable logic.

35. The signal processing system of claim 25 wherein the first audio output device is a first speaker and the signal processing system further comprises the first speaker and multiple additional speakers coupled to the level dependent bass frequency management system.

36. The system of claim 13 wherein the control logic also substantially preserves directionality and balance of the audio input signal during boosting and processing.

37. An apparatus to provide audio input signal level dependent bass frequency management, the apparatus comprising:

means for receiving an audio input signal associated with at least a first speaker, wherein the first speaker attenuates signals in a low frequency range;

means for detecting a low frequency level of the audio input signal;

means for boosting components of the audio input signal in the low frequency range by an amount sufficient to at least partially compensate for low frequency attenuation of the first speaker without exceeding one or more acceptable limitations of the signal processing system;

means for determining if the detected low frequency level of the audio input signal and one or more limitations of the signal processing system restrict boosting the low frequencies to substantially compensate for the low frequency attenuation of the first speaker to make a restricted boosting determination;

means for selecting an alternate low frequency management solution upon making the restricted boosting determination; and means for processing the audio input signal using the selected alternate low frequency management solution after selection of the alternate low frequency management solution.

38. The apparatus of claim 37 wherein the means for boosting further comprises:

means for increasing a gain of the audio input signal only by an amount that preserves a substantially flat frequency response of the speaker.

39. The apparatus of claim 37 further comprising:

means for routing frequency components of the audio input signal to a second speaker, wherein the frequency components routed to the second speaker comprise frequency components in the low frequency range attenuated by the first speaker.

40. The apparatus of claim 37 further comprising:

means for applying a psycho-acoustic bass extension algorithm to frequency components of the audio input signal in the unacceptable frequency response range of the first speaker for the level of the audio input signal.

41. The apparatus of claim 37 wherein the alternate low frequency management solution comprises one or more members of the group comprising:

(i) means for processing the components of the audio input signal in the low frequency range to generate an output signal for routing to a second speaker;

(ii) means for applying a psycho-acoustic bass extension algorithm to frequency components of the audio input signal in the unacceptable frequency response range of the first speaker for the level of the audio input signal; and (iii) means for continued boosting of components of the audio input signal in the low frequency range by an amount sufficient to at least partially compensate for low frequency attenuation of the first speaker without exceeding one or more acceptable limitations of the signal processing system.

42. The apparatus of claim 37 further comprising:

means for filtering the audio input signal using a high pass filter and a low pass filter, wherein the cut-off frequency of the high pass filter and the cut-off frequency of the low pass filter depend upon the low frequency level of the audio input signal, and the cut-off frequency of the low pass filter defines the upper frequency of the low frequency range.

43. The apparatus of claim 37 further comprising:

means for predetermining modifications of the audio input signal for a plurality of levels of the audio input signal.

44. The method of claim 1 wherein the alternate low frequency management solution comprises a combination of multiple low frequency management solutions.

* * * * *